US008134859B1

(12) United States Patent
Novosel et al.

(10) Patent No.: US 8,134,859 B1
(45) Date of Patent: Mar. 13, 2012

(54) METHOD OF SENSING A PROGRAMMABLE NON-VOLATILE MEMORY ELEMENT

(75) Inventors: Walter Novosel, New Wilmington, PA (US); Ethan Sieg, Hermitage, PA (US); Gary Craig, Carnegie, PA (US); David Novosel, New Wilmington, PA (US); Elaine Novosel, legal representative, West Middlesex, PA (US)

(73) Assignee: Novocell Semiconductor, Inc., Hermitage, PA (US)

( * ) Notice: Subject to any disclaimer, the term of this patent is extended or adjusted under 35 U.S.C. 154(b) by 0 days.

(21) Appl. No.: 12/889,659

(22) Filed: Sep. 24, 2010

Related U.S. Application Data

(60) Provisional application No. 61/245,794, filed on Sep. 25, 2009.

(51) Int. Cl.
*G11C 11/00* (2006.01)
(52) U.S. Cl. .................................... 365/148; 365/225.7
(58) Field of Classification Search .................. 365/148, 365/225.7
See application file for complete search history.

(56) References Cited

U.S. PATENT DOCUMENTS

| | | | |
|---|---|---|---|
| 4,800,297 A | 1/1989 | Novosel et al. |
| 4,801,891 A | 1/1989 | Novosel et al. |
| 4,874,965 A | 10/1989 | Campardo et al. |
| 4,888,497 A | 12/1989 | Dallabora et al. |
| 5,703,804 A | 12/1997 | Takata et al. |
| 5,737,260 A | 4/1998 | Takata et al. |
| 5,828,596 A | 10/1998 | Takata et al. |
| 6,158,613 A | 12/2000 | Novosel et al. |
| 6,175,262 B1 | 1/2001 | Savelli et al. |
| 6,650,143 B1 | 11/2003 | Peng |
| 6,667,902 B2 | 12/2003 | Peng |
| 6,671,040 B2 | 12/2003 | Fong et al. |
| 6,700,151 B2 | 3/2004 | Peng |
| 6,766,960 B2 | 7/2004 | Peng |
| 6,775,171 B2 | 8/2004 | Novosel et al. |
| 6,775,197 B2 | 8/2004 | Novosel et al. |
| 6,777,757 B2 | 8/2004 | Peng et al. |
| 6,791,891 B1 | 9/2004 | Peng et al. |
| 6,798,693 B2 | 9/2004 | Peng |
| 6,816,427 B2 | 11/2004 | Novosel et al. |
| 6,822,888 B2 | 11/2004 | Peng |
| 6,856,540 B2 | 2/2005 | Peng et al. |
| 6,898,116 B2 | 5/2005 | Peng |
| 6,924,664 B2 | 8/2005 | Wang |
| 6,940,751 B2 | 9/2005 | Peng et al. |
| 6,956,258 B2 | 10/2005 | Peng |
| 6,972,986 B2 | 12/2005 | Peng et al. |

(Continued)

*Primary Examiner* — Michael Tran
(74) *Attorney, Agent, or Firm* — Lando & Anastasi, LLP

(57) ABSTRACT

A non-volatile memory cell including an antifuse element having a programming node and a control node, a capacitor element, a precharge element, an access element, and a leakage element. The antifuse element is configured to have changed resistivity (representing a change in logic state) after the programming node is subjected to one or more voltage pulses. The capacitor element, coupled to the programming node, is configured to provide the one or more voltage pulses to the programming node. The precharge element, coupled to the programming node, is configured to increase the one or more voltage pulses provided to the programming to node. The access element, coupled to the control node, is configured to allow determination of the logic state of the antifuse element based on current flow through the access element. The leakage element is coupled to the control node and configured to modify the current flowing through the access element when the resistivity of the antifuse element has not been changed.

2 Claims, 3 Drawing Sheets

U.S. PATENT DOCUMENTS

| | | | |
|---|---|---|---|
| 6,992,925 B2 | 1/2006 | Peng | |
| 7,031,209 B2 | 4/2006 | Wang et al. | |
| 7,042,772 B2 | 5/2006 | Wang et al. | |
| 7,173,851 B1 | 2/2007 | Callahan et al. | |
| 7,269,047 B1 | 9/2007 | Fong et al. | |
| 7,402,855 B2 | 7/2008 | Kurjanowicz | |
| 7,471,540 B2 | 12/2008 | Luan et al. | |
| 7,471,541 B2 | 12/2008 | Fong et al. | |
| 7,511,982 B2 | 3/2009 | Kurjanowicz et al. | |
| 7,586,787 B2 | 9/2009 | Vo et al. | |
| 7,609,539 B2 | 10/2009 | Peng et al. | |
| 7,623,368 B2 | 11/2009 | Luan | |
| 7,642,138 B2 | 1/2010 | Kurjanowicz | |
| 7,755,162 B2 | 7/2010 | Kurjanowicz et al. | |
| 7,764,532 B2 | 7/2010 | Kurjanowicz et al. | |
| 7,772,063 B2 | 8/2010 | Novosel | |
| 7,817,456 B2 | 10/2010 | Kurjanowicz | |
| 7,907,465 B2 | 3/2011 | Peng et al. | |
| 2002/0075743 A1* | 6/2002 | Ooishi et al. | 365/225.7 |
| 2006/0232296 A1 | 10/2006 | Wang et al. | |
| 2006/0233082 A1* | 10/2006 | Lee et al. | 369/59.23 |
| 2009/0250726 A1 | 10/2009 | Kurjanowicz | |
| 2009/0251943 A1 | 10/2009 | Kurjanowicz | |
| 2009/0262566 A1 | 10/2009 | Kurjanowicz | |
| 2009/0290434 A1 | 11/2009 | Kurjanowicz | |
| 2010/0002527 A1 | 1/2010 | Kurjanowicz | |
| 2010/0011266 A1 | 1/2010 | Kurjanowicz | |
| 2010/0202183 A1 | 8/2010 | Kurjanowicz | |
| 2010/0220511 A1 | 9/2010 | Kurjanowicz | |
| 2010/0244115 A1 | 9/2010 | Kurjanowicz et al. | |
| 2010/0259965 A1 | 10/2010 | Kurjanowicz et al. | |
| 2011/0019491 A1 | 1/2011 | Kurjanowicz et al. | |

\* cited by examiner

METHOD OF SENSING A PROGRAMMABLE NON-VOLATILE MEMORY ELEMENT

RELATED APPLICATIONS

This application claims priority under 35 U.S.C. §119(e) to U.S. Provisional Application Ser. No. 61/245,794, entitled "METHOD OF SENSING A PROGRAMMABLE NON-VOLATILE MEMORY ELEMENT," filed on Sep. 25, 2009, which is herein incorporated by reference in its entirety. This application is related to U.S. application Ser. No. 12/887,956 entitled "NON-VOLATILE MEMORY ELEMENT INTEGRATABLE WITH STANDARD CMOS CIRCUITRY," filed on Sep. 22, 2010, and to U.S. application Ser. No. 12/889,653, entitled "MULTIPLE TIME PROGRAMMABLE NON-VOLATILE MEMORY ELEMENT," filed on Sep. 24, 2010.

BACKGROUND OF INVENTION

Embodiments of the present invention relate to non-volatile memories, and more particularly, to embedded memories for combination with other integrated circuitry.

SUMMARY OF INVENTION

The present invention provides a non-volatile memory cell and associated programming methods that allow for the integration of non-volatile memory with other CMOS integrated circuitry utilizing the standard CMOS processing used to manufacture the other CMOS integrated circuitry. Embodiments of the present invention provide a non-volatile memory cell that includes an antifuse element which is programmed by breaking down the antifuse element and which is sensed by detecting antifuse element conduction. The non-volatile cell structure and programming methods of the present invention, therefore, provide a desirable solution for embedded memory architectures.

As technology feature sizes reduce there is an increase in the antifuse element leakage which makes it increasingly difficult to differentiate the conduction of a broken down antifuse element that was programmed versus a non-broken antifuse element where the conduction is from leakage. Embodiments of the present invention provide a method of sensing a cell that was programmed in a technology with a significant antifuse leakage.

In accordance with an aspect of the present invention, a non-volatile memory cell is provided. The non-volatile memory cell includes an antifuse element, a capacitor element, a precharge element, an access element, and a leakage element. The antifuse element has a programming node and a control node and is configured to have changed resistivity after the programming node is subjected to one or more voltage pulses, the change in resistivity representing a change in logic state. The capacitor element is coupled to the programming node and configured to provide the one or more voltage pulses to the programming node. The precharge element is coupled to the programming node and configured to increase the one or more voltage pulses provided to the programming node. The access element is coupled to the control node and configured to allow determination of the logic state of the antifuse element based on current flow through the access element. The leakage element is coupled to the control node and configured to modify the current flowing through the access element when the resistivity of the antifuse element has not been changed.

In accordance with one embodiment, the antifuse element comprises a MOS transistor having a gate, a source, and a drain, wherein the gate of the MOS transistor is coupled to programming node of the antifuse element and where the source and drain of the MOS to transistor are coupled to the control node of the antifuse element. In accordance with an alternative embodiment, the gate of the MOS transistor is coupled to the control node of the antifuse element and the source and drain of the MOS transistor are coupled to the programming node of the antifuse element.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
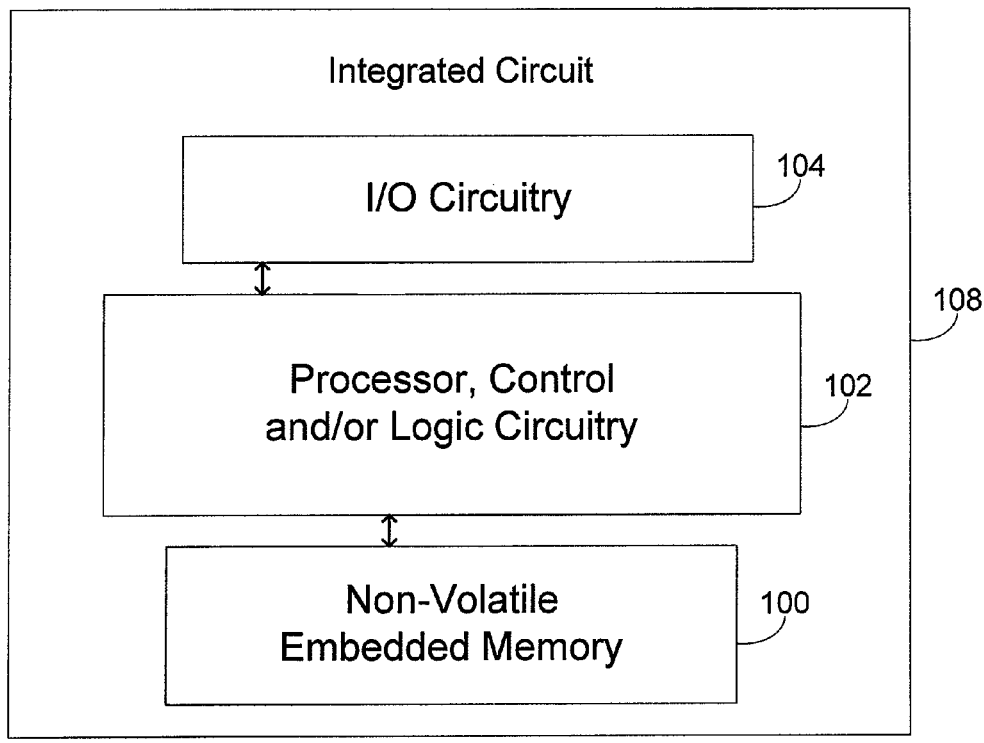
FIG. 1A is a block diagram of an integrated circuit including embedded non-volatile memory according to an aspect of the present invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of to description and should not be regarded as limiting. The use of "including," "comprising," "having," "containing," "involving," and variations thereof herein is meant to encompass the items listed thereafter and equivalents thereof as well as additional items.

The present invention provides a non-volatile memory cell and associated programming methods that allow for the integration of non-volatile memory with other CMOS integrated circuitry utilizing the standard CMOS processing used to manufacture the other CMOS integrated circuitry. Thus, the non-volatile cell structure and programming methods, therefore, provide a desirable solution for embedded memory architectures.

FIG. 1A is a block diagram for an integrated circuit 108 including embedded non-volatile memory 100 according to an aspect of the present invention. As discussed in more detail below, the non-volatile memory cell architecture of the present invention lends itself to being manufactured using standard CMOS processing. Thus, rather than requiring additional processing steps or post processing combination, the embedded non-volatile memory of the present invention can be fabricated at the same time the other circuitry is being fabricated. As such, the integrated circuit 108 can include a wide variety of other circuitry as represented by input/output (I/O) circuitry 104 and processor, control and/or logic circuitry 102. It is noted, therefore, that the actual circuitry fabricated with the embedded non-volatile memory 100 could vary depending upon the operational functionality desired.

Figure 1B:
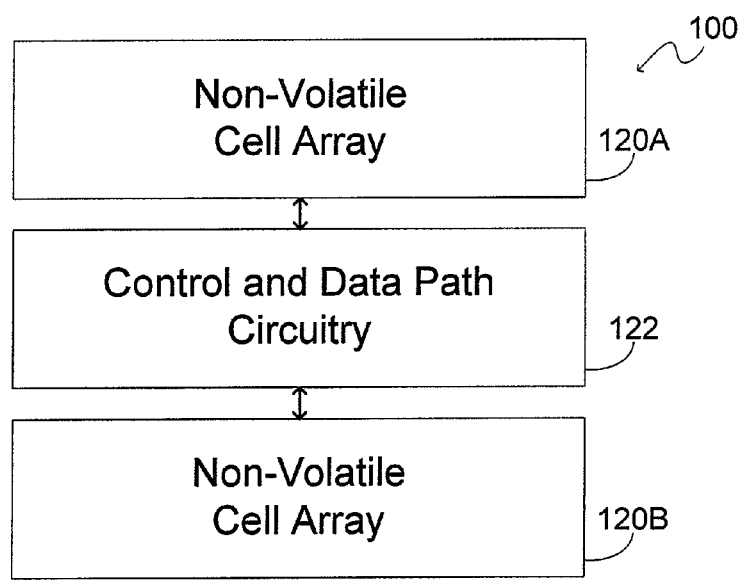
FIG. 1B is a block diagram for an embedded non-volatile memory block including a dual bank cell array.

FIG. 1B is a block diagram for an embedded non-volatile memory block 100. In the embodiment depicted, the embedded non-volatile memory block 100 has been broken into a dual bank array so that non-volatile cell array 120A and non-volatile memory cell array 120B make up the available memory for the memory block 100. Also shown is control and data path circuitry 122 that provides control and communication functions for the memory array block 100. It is noted that the actual circuitry implemented for the memory block 100 could vary depending upon the operational functionality desired.

Figure 2:
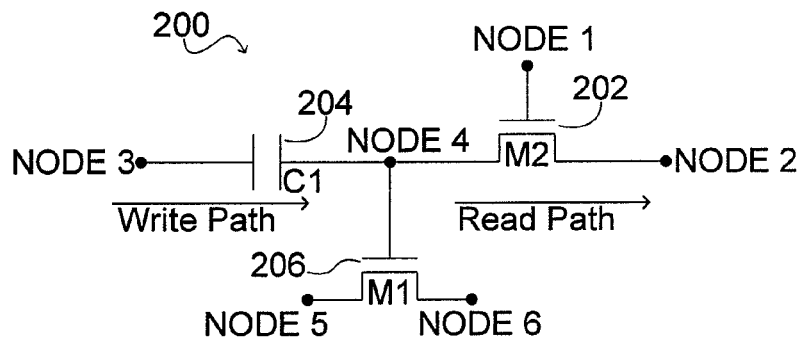
FIG. 2 is a circuit diagram of a non-volatile memory element according to an embodiment of the present invention including an antifuse element, a writing capacitor and an access transistor.

FIG. 2 is a circuit diagram for a non-volatile memory element 200 according to an embodiment of the present invention including an antifuse element (M1) 206, a writing capacitor (C1) 204 and an access transistor (M2) 202. In operation, NODE 1 is connected to the gate of the access transistor M2 to control its operation. NODE 2 is coupled through the access transistor M2 to the internal NODE 4. The capacitor C1 is connected between NODE 3 and NODE 4. NODE 4 is connected to the gate of antifuse element transistor M1. NODE 5 is connected to the source of the transistor M1, and NODE 6 is connected to the drain of transistor M1. It is noted that NODE 6 could be connected to the source of the transistor M1, and NODE 5 could be connected to the drain of transistor M1 as an alternate embodiment. As shown, the transistors are NMOS devices. It is noted that PMOS transistors or other device types could be utilized for the access device. The capacitor C1 may be a MOS transistor connected such that the gate provides one terminal of the capacitor C1 and such that the source and drain are connected together to provide the other terminal of the capacitor C1. The capacitor C1 could also be formed by using two conductive layers of metal or polysilicon and a dielectric layer to form a capacitor structure. As shown, NODE 4 is connected to the gate of antifuse element transistor M1 and NODES 5/6 are connected to the source/drain of the antifuse element transistor M1, respectively. It is noted that NODE 4 could be connected to both the source and the drain of the antifuse element transistor M1 and NODES 5/6 could be connected together and to the gate of antifuse element transistor M1.

The non-volatile memory element 200 advantageously utilizes an antifuse element 206 that can be fabricated in standard CMOS processes without requiring special processing. This antifuse element 206 can be formed, for example, by using a standard gate oxide dielectric layer as an insulator. This insulator can then be made to become conductive by electrical means. For example, insulating layers, such as silicon dioxide ($SiO_2$), can have a voltage applied across them, and the insulator will not permit current to flow. If a sufficiently high field is applied, however, the oxide will breakdown and cause a fast discharge of the voltage across the oxide. This rapid discharge usually results in a change in the oxide or damage to the oxide that eliminates its insulating characteristic, so that the oxide will now conduct electrical current. This change in resistivity or conductive state can be used to represent the logic state of the antifuse element.

To cause the dielectric layer to become conductive, a voltage of sufficient magnitude must typically be applied across the dielectric layer. Oxides will generally become conductive with exposure to high voltages where stress is induced and charge is conducted through the oxides. Thick oxides generally behave in a manner that is typical of insulators, that is, they will tolerate an increasing field until a certain high potential, and then the oxide will break down. Below this breakdown, there is only a small current (called Fowler-Nordheim tunneling). Then, at a certain voltage level, the current will rise sharply, and significant charge will flow through the oxide. If the current is large enough, damage will occur to the oxide, and the oxide will become conductive. In some cases, one breakdown event may not be enough to to cause the oxide to change permanently to a conductive state. Rather, a series of breakdown events may be needed to cause the oxide to become conductive. In thinner oxides, there can be other modes of conduction, such as direct tunneling, and these currents may prevent the easy build up of voltage across the oxide. As the voltage increases, the current through the oxide will increase, and likewise the current will decrease if the voltage is decreased. These oxides must typically conduct a significant amount of charge before the insulating characteristics are lost. This charge to breakdown ($Q_{bd}$) must be driven through the insulator to cause it to change states, from an insulator to a conductor.

In particular, in the embodiment of FIG. 2, the transistor M1 is the dielectric layer breakdown device or antifuse element. In one example, NODES 5 and 6 can be held near zero volts or ground, and NODE 4 is driven to a high voltage for writing to the antifuse device M1. To drive NODE 4 to a high voltage level, a pre-charge step may be used in conjunction with a voltage boost step. In a pre-charge step, transistor M2 is used to charge up the programming NODE 4 to a first pre-charge voltage level. To effect this pre-charge step, a voltage, such as a voltage near the supply voltage (Vdd) or preferably to a pumped supply voltage (Vpp), is applied to NODE 2 of the access transistor M2, and a voltage at least a Vth above the Vpp level is applied to NODE 1 (Vpp+Vth, where Vth is the threshold voltage of M2). This pre-charge step will drive NODE 4 to Vpp level. In the voltage boost operation, NODE 4 is first isolated by reducing the voltage at NODE 1 to a Vpp level or below thereby turning "off" the access transistor M2, and a Vpp level voltage pulse is applied to NODE 3 of capacitor C1. Due to the nature of capacitors, this action causes NODE 4 to rise along with NODE 3, thereby raising NODE 4 to a high level voltage, for example approximately 2-times Vpp or 2 Vpp, assuming NODE 4 was pre-charged to a Vpp voltage level. Thus, this circuit configuration allows for raising the internal programming voltage within the non-volatile memory cell to a higher voltage, such as a voltage that is approximately 2-times the voltages being applied to the capacitor C1 and the access transistor M2.

In this write operation, therefore, the disclosed memory cell structure of FIG. 2 can double the applied voltage inside the memory element or cell 200. This capability of doubling the applied voltage in the cell is a significant benefit of the disclosed structure. This feature, therefore, allows the memory cell to be made without high voltage transistors throughout the design by confining the high voltage to a single node in the memory cell. This doubling within the cell allows the other circuitry that drives the memory core to operate at lower voltages, for example, at Vcc or Vpp. Special high voltage transistors are not required to deliver to the memory core the high voltages that are needed to write the memory elements. In the structure of FIG. 2, the high voltage appears across the dielectric layer of antifuse element M1 and is confined to NODE 4. In the example above, therefore, the voltage across the access transistor M2 and capacitor C1 is Vpp, and the voltage across the dielectric layer of the antifuse element M1 is 2 Vpp. It is noted that the FIG. 2 depicts the use of an antifuse element M1 that is capable of being written to once because the dielectric layer breakdown is typically not reversible once it has occurred. However, the internal memory cell voltage doubling technique could also be used with other memory elements that could be re-writable, if desired. It is further noted that the voltage boosting technique could be utilized to drive the internal programming voltage of the non-volatile memory cell to even higher voltages that exceed a voltage that is double the voltage being applied to the capacitor or the access device for the non-volatile memory cell, if such higher voltages were desired for a particular implementation. In addition, the voltage boosting technique could also be used to generate internal programming voltages that are higher than the applied voltages but lower than double the applied voltages. In short, a wide range of elevated voltages could be achieved, as desired, utilizing the capacitor voltage boosting technique of the present invention.

To read the state of the antifuse element M1, a voltage is applied across the antifuse element and then read circuitry will detect if there is a current flow through the dielectric layer of the antifuse element. For example, NODE 2 can be driven to an initial voltage, such as 1 volt, and NODE 1 can be driven to a positive voltage, such as Vdd. If the dielectric layer within the antifuse element M1 is conducting, a current will flow from NODE 2, through transistor M2 to NODE 4 and then NODE 5 and/or NODE 6 through the dielectric layer of antifuse element M1. If the dielectric layer within the antifuse element M1 is not conducting, then there would be no current flowing from NODE 2 to NODE 5 and/or NODE 6 of the antifuse element M1. The current flow determination and the no current flow state are then used to determine the resistivity state of the antifuse element and thereby to determine the logic state of the non-volatile memory cell 200. For example, dielectric layer breakdown and associated current flow could define a logic "1," and no current flow could define a logic "0."

As indicated above with respect to FIGS. 1A and 1B, the memory cell structure 200 of FIG. 2 can be used in an array of write-once memory cells, and the read selection of an individual cell can be done by the respective voltages applied to the NODE 1 and NODE 2 of the individual cells. For example, NODE 1 could be used to select a row of non-volatile memory cells in an array, while the column could be selected by NODE 2. Row and column selection circuitry that may be used with the memory cell structure 200 of FIG. 2 is described in commonly owned U.S. Pat. No. 6,775,197, which is incorporated by reference herein in its entirety.

Figure 3:
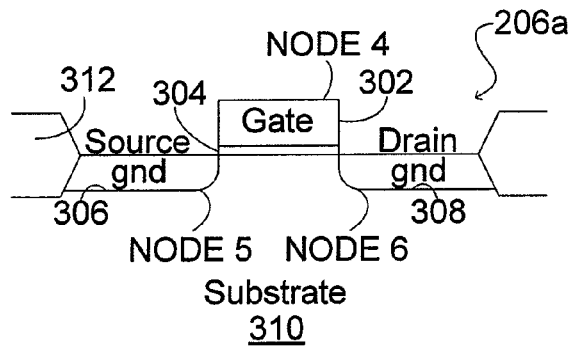
FIG. 3 is a cross-sectional diagram of a non-volatile antifuse element according to one embodiment of the present invention.

FIG. 3 is a cross-sectional diagram for a non-volatile antifuse element (M1) 206 according to an embodiment of the present invention. In this embodiment, the antifuse element 206a is fabricated as an NMOS transistor device. For example, the substrate 310 can be p-type with a n-type channel existing between the source 306 and the drain 308. It is noted that NODE 6 could be connected to the source 306, and NODE 5 could be connected to the drain 308 as an alternate embodiment. The n-type gate 302 sits above the channel region and sits on top of a dielectric layer 304. With respect to FIG. 2, NODE 4 is connected to the gate 302, NODE 5 is connected to the source 306, and NODE 6 is connected to the drain 308. In addition, as depicted in FIG. 3, the source 306 and the drain 308 are both coupled to a ground voltage level. The source 306 and drain 308 are surrounded by a dielectric layer 312 that could be field oxide, shallow trench isolation or local oxidation of silicon. It is noted that other device types could be utilized for the antifuse element, such as PMOS transistor devices, devices that have a dielectric layer positioned between two conductive layers, and/or any other device element that is configured to have different resistivity after a programming node is subjected to one or more voltage pulses such that a change in resistivity can represent a change in logic state.

The dielectric layer 304, usually silicon dioxide, requires that a certain amount of current pass through an area of the oxide to cause it to become conductive. In thicker dielectrics, this breakdown can happen rather quickly when a large voltage is applied. Thus, a very high but very short pulse of current will often cause conduction and will generally cause conduction in the weakest part or parts of the dielectric layer. If there are several weak spots in the oxide, then current will often be shared through these weak areas. In thinner dielectrics, however, the oxide will conduct current more uniformly across the area of the dielectric layer. As a voltage is applied, the oxide will conduct and load down the applied voltage, thereby tending to decrease the voltage across the oxide. In most cases, the available current is limited. As such, it is desirable to minimize the oxide area that is conducting and to concentrate the current in as small of an area as possible. This concentration will reduce the total amount of current that is needed to conduct through the oxide to cause breakdown and/or will reduce the time that is needed to achieve breakdown of the oxide.

With respect to FIG. 3 and dielectric layer 304, therefore, it is desirable to fabricate the antifuse element 206a with a minimal area for the dielectric layer 304. For example, the area of the dielectric layer 304 may be fabricated using minimum dimensions for the gate oxide area that are allowed with respect to the integrated circuit being fabricated. These minimum dimensions are typically provided by the manufacturer, and no structure can typically be used in the layout of the memory element that is smaller than the dimensions allowed by the manufacturing processing being utilized.

With respect to FIG. 3 and the breakdown of the dielectric layer 304, the structure will show characteristics similar to a diode after the breakdown has occurred. When the dielectric layer 304 breaks down, a conductive path is formed from the gate 302 to the substrate 310 and from substrate 310 to the source 306 or drain 308. For example, the substrate 310 can be p-type with an n-type source 306 and drain 308. The n-type gate 302 sits above the channel region and sits on top of a dielectric layer 304. The conductive path from the n-type gate 302 to the p-type substrate 310 will be a diode and the conductive path from the p-type substrate 310 to the n-type source 306 or drain 308 will be a diode. The diode from the p-type substrate 310 to the n-type source 306 or drain 308 will be shorted out since they are both tied to ground. The p-n junction between the n-type gate 302 and the p-type substrate 310 will require a higher voltage on the gate 302 to sense the dielectric layer 304 break down since the channel must be inverted. Other CMOS structures that may be used to form a non-volatile antifuse element are described in co-pending application Ser. No. 12/887,956, filed Sep. 22, 2010 and entitled "NON-VOLATILE MEMORY ELEMENT INTEGRATABLE WITH STANDARD CMOS CIRCUITRY," which is incorporated herein by reference in its entirety.

Figure 4:
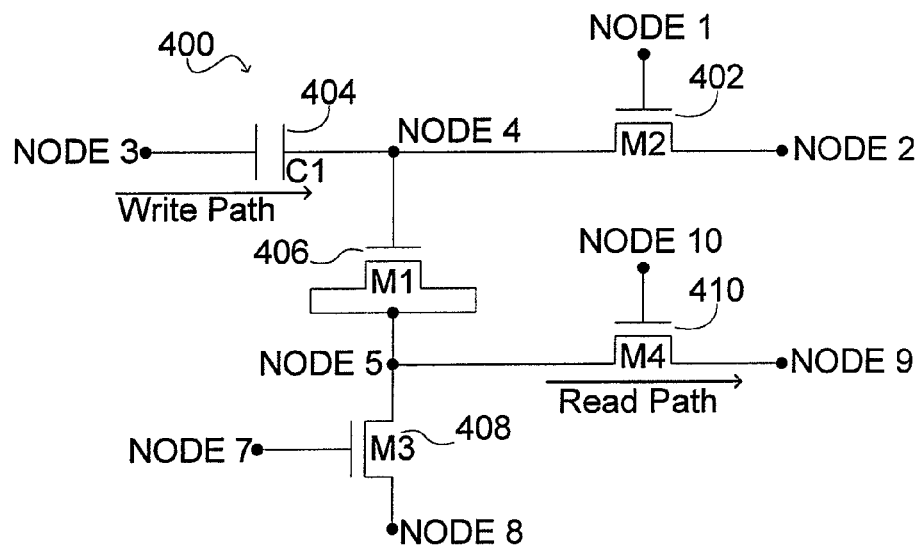
FIG. 4 is a circuit diagram of a non-volatile memory element according to an embodiment of the present invention that includes an antifuse element, a writing capacitor, a pre-charge transistor, a sense current transistor, and an access transistor.

FIG. 4 is a circuit diagram for a non-volatile memory element 400 according to an embodiment of the present invention that includes an antifuse element (M1) 406, a writing capacitor (C1) 404, a pre-charge transistor (M2) 402, a sense current transistor (M3) 408, and an access transistor (M4) 410. In operation, NODE 1 is connected to the gate of the pre-charge transistor M2 to control its operation. NODE 2 is coupled through the pre-charge transistor M2 to the internal NODE 4. The capacitor C1 is connected between NODE 3 and NODE 4. NODE 4 is connected to the gate of antifuse element transistor M1. NODE 5 is connected to the source and drain of the antifuse element transistor M1. NODE 7 is connected to the gate of the sense current transistor M3 to control its operation. NODE 8 is coupled through the sense current transistor M3 to internal NODE 5. NODE 9 is coupled through the access transistor M4 to the internal NODE 5. NODE 10 is connected to the gate of the access transistor M4 to control its operation. As shown, the transistors are NMOS devices. It is noted that PMOS to transistors or other device types could be utilized. The capacitor C1 may be a MOS transistor connected such that the gate provides one terminal of the capacitor C1 and such that the source and drain are connected together to provide the other terminal of the capacitor C1. The capacitor C1 could also be formed by using two conductive layers of metal or polysilicon and a dielectric layer to form a capacitor structure.

In particular, in the embodiment of FIG. 4, the transistor M1 is the dielectric layer breakdown device or antifuse element. In one example, NODE 8 can be held near zero volts or ground and NODE 7 can be driven to a positive voltage, such as Vdd, to drive NODE 5 near zero volts or ground. NODE 4 is driven to a high voltage for writing to the antifuse device M1. To drive NODE 4 to a high voltage level, a pre-charge step may be used in conjunction with a voltage boost step. In a pre-charge step, transistor M2 is used to charge up the programming NODE 4 to a first pre-charge voltage level. To effect this pre-charge step, a voltage, such as a voltage near the supply voltage (Vdd) or preferably to a pumped supply voltage (Vpp), is applied to NODE 2 of the pre-charge transistor M2, and a voltage at least a Vth above the Vpp level is applied to NODE 1 (Vpp+Vth, where Vth is the threshold voltage of M2). This pre-charge step will drive NODE 4 to Vpp level. In the voltage boost operation, NODE 4 is first isolated by reducing the voltage at NODE 1 to a Vpp level or below and a Vpp level voltage pulse is applied to NODE 3 of capacitor C1. Due to the nature of capacitors, this action causes NODE 4 to rise along with NODE 3, thereby raising NODE 4 to a high level voltage, for example approximately 2-times Vpp or 2 Vpp, assuming NODE 4 was pre-charged to a Vpp voltage level. Thus, this circuit configuration allows for raising the internal programming voltage within the non-volatile memory cell to a higher voltage, such as a voltage that is 2-times or more the voltages being applied to the capacitor C1.

To read the state of the antifuse element M1, a voltage is applied across the antifuse element and then read circuitry will detect if there is a conduction path through the dielectric layer of the antifuse element. For example, NODE 2 can be driven to a positive voltage, such as vdd. NODE 1 can be driven to a positive voltage, such as vdd, or to a voltage at least a threshold above the voltage on NODE 2. NODE 9 can be driven to an initial voltage, such as zero volts or ground, and NODE 10 can be driven to a positive voltage, such as Vdd. If the dielectric layer within the antifuse element M1 is conducting, a current will flow through the pre-charge transistor M2 to NODE 4, through the dielectric layer of antifuse element M1, to NODE 5 and then through access transistor M4 to NODE 9. If the dielectric layer within the to antifuse element M1 is not conducting, then there would be no current flowing to NODE 9 from the antifuse element M1.

As technology feature sizes are reduced there is an increase in the gate dielectric layer leakage which makes it increasingly difficult to sense the conduction of a broken down gate dielectric layer that was programmed versus a non-broken gate dielectric layer where the conduction is from leakage. In particular, in the embodiment of FIG. 4, the sense current transistor M3 may be used for smaller technology feature sizes. In one example, NODE 2 can be driven to a positive voltage, such as vdd. NODE 1 can be driven to a positive voltage, such as vdd, or to a voltage at least a threshold above the voltage on NODE 2. NODE 9 can be driven to an initial voltage, such as zero volts or ground, and NODE 10 can be driven to a positive voltage, such as Vdd. If the dielectric layer within the antifuse element M1 is conducting, a current will flow through the pre-charge transistor M2 to NODE 4, through the dielectric layer of antifuse M1 to NODE 5, and then through access transistor M4 to NODE 9. If the dielectric layer within the antifuse element M1 is not conducting, then there would be no current flowing to NODE 9 from the antifuse element M1. If the dielectric layer within the antifuse element M1 is not conducting due to being programmed but is conducting due to dielectric layer leakage, then there would be current flowing to NODE 9 from the antifuse element M1 which is undesirable. Embodiments of the present invention use the sense current transistor M3 to avoid the undesirable current flowing to NODE 9 for this case. In particular, the sense current transistor M3 may have NODE 7 and NODE 8 driven such that current is flowing from NODE 5 through M3 into NODE 8. This current flow will prevent having NODE 5 from being driven to a positive voltage due to the dielectric layer leakage current of the antifuse element M1. In one example, NODE 8 can be coupled to zero volts or ground and NODE 7 can be coupled to voltage reference that will set the current through M3. The current flow determination through the access transistor M4 is then used to determine the resistivity state of the antifuse element and thereby to determine the logic state of the non-volatile memory cell 400. For example, dielectric layer breakdown and associated current flow could define a logic "1," and no current flow could define a logic "0."

As shown, the sensing current transistor M3 and access transistor M4 are coupled to the source and drain of the antifuse element M1. It is noted that sensing current transistor M3 and access transistor M4 could be coupled to the gate of the antifuse element M1 as an alternate embodiment. It is also noted that an alternative embodiment could have the current flowing through the antifuse element in the opposite direction.

Figure 5:
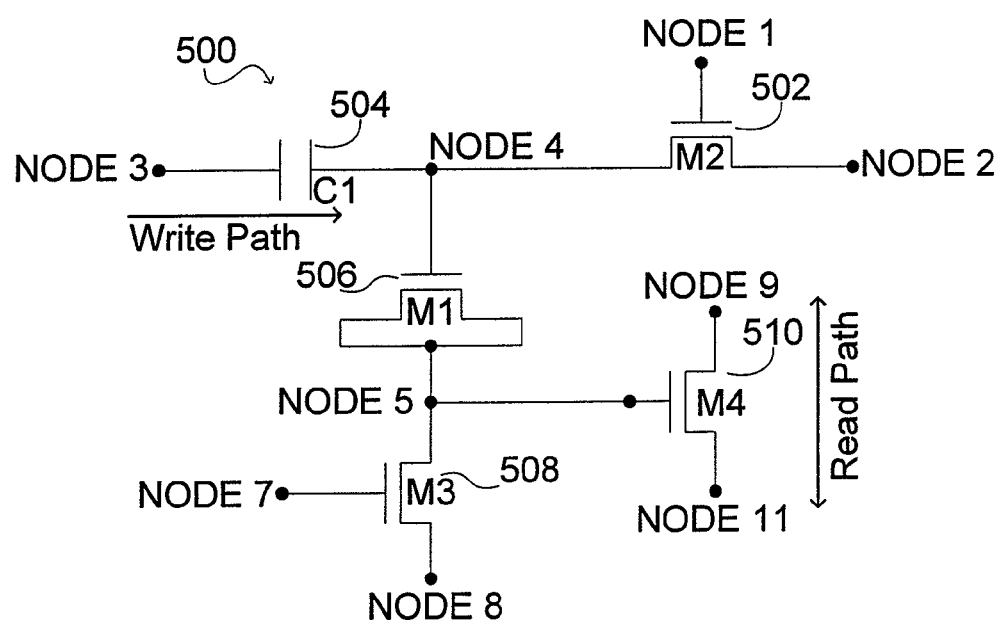
FIG. 5 is a circuit diagram of a non-volatile memory element according to another embodiment of the present invention that includes an antifuse element, a writing capacitor, a pre-charge transistor, a sense current transistor, and an access transistor.

FIG. 5 is a circuit diagram of a non-volatile memory element 500 according to another embodiment of the present invention that includes an antifuse element (M1) 506, a writing capacitor (C1) 504, a pre-charge transistor (M2) 502, a sense current transistor (M3) 508, and an access transistor (M4) 510. In operation, NODE 1 is connected to the gate of the pre-charge transistor M2 to control its operation. NODE 2 is coupled through the pre-charge transistor M2 to the internal NODE 4. The capacitor C1 is connected between NODE 3 and NODE 4. NODE 4 is connected to the gate of antifuse element transistor M1. NODE 5 is connected to the source and drain of the antifuse element transistor M1. NODE 7 is connected to the gate of the sense current transistor M3 to control its operation. NODE 8 is coupled through the sense current transistor to internal NODE 5. NODE 9 is coupled through the access transistor M4 to the NODE 11. Internal NODE 5 is connected to the gate of the access transistor M4 to control its operation. As shown, the transistors are NMOS devices. It is noted that PMOS transistors or other device types could be utilized. The capacitor C1 may be a MOS transistor connected such that the gate provides one terminal of the capacitor C1 and such that the source and drain are connected together to provide the other terminal of the capacitor C1. The capacitor C1 could also be formed by using two conductive layers of metal or polysilicon and a dielectric layer to form a capacitor structure.

In particular, in the embodiment of FIG. 5, the transistor M1 is the dielectric layer breakdown device or antifuse element. In one example, NODE 8 can be held near zero volts or ground and NODE 7 can be driven to a positive voltage, such as Vdd, to drive NODE 5 near zero volts or ground. NODE 4 is driven to a high voltage for writing to the antifuse device M1. To drive NODE 4 to a high voltage level, a pre-charge step may be used in conjunction with a voltage boost step. In a pre-charge step, transistor M2 is used to charge up the programming NODE 4 to a first pre-charge voltage level. To effect this pre-charge step, a voltage, such as a voltage near the supply voltage (Vdd) or preferably to a pumped supply voltage (Vpp), is applied to NODE 2 of the pre-charge transistor M2, and a voltage at least a Vth above the Vpp level is applied to NODE 1 (Vpp+Vth, where Vth is the threshold voltage of M2). This pre-charge step will drive NODE 4 to Vpp level. In the voltage boost operation, NODE 4 is first isolated by reducing the voltage at NODE 1 to a Vpp level or below and a Vpp level voltage pulse is applied to NODE 3 of capacitor C1. Due to the nature of capacitors, this action causes NODE 4 to rise along with NODE 3, thereby raising NODE 4 to a high level voltage, for example approximately 2-times Vpp or 2 Vpp, assuming NODE 4 was pre-charged to a Vpp voltage level. Thus, this circuit configuration allows for raising the internal to programming voltage within the non-volatile memory cell to a higher voltage, such as a voltage that is 2-times or more the voltages being applied to the capacitor C1.

To read the state of the antifuse element M1, a voltage is applied across the antifuse element and then read circuitry will detect if there is a conduction path through the dielectric layer of the antifuse element. For example, NODE 2 can be driven to a positive voltage, such as vdd. NODE 1 can be driven to a positive voltage, such as vdd, or to a voltage at least a threshold above the voltage on NODE 2. NODE 9 can be driven to an initial positive voltage, such as vdd, NODE 11 can be driven to zero volts or ground. If the dielectric layer within the antifuse element M1 is conducting, a current will flow through the pre-charge transistor M2 to NODE 4, through the dielectric layer of antifuse element M1 to NODE 5 which will enable the current to flow through the access transistor M4 discharging NODE 9. If the dielectric layer within the antifuse element M1 is not conducting, then there would be no current flowing through M4 from the antifuse element M1. If the dielectric layer within the antifuse element M1 is not conducting due to being programmed but is conducting due to dielectric layer leakage, then there would be current flowing through M4 from the antifuse element M1. The sense current transistor M3 may have NODE 7 and NODE 8 driven such that current is flowing from NODE 5 through M3 into NODE 8. This current flow will prevent having NODE 5 from being driven to a positive voltage due to the dielectric layer leakage current of the antifuse element M1. The current flow determination through the access transistor M4 is then used to determine the resistivity state of the antifuse element and thereby to determine the logic state of the non-volatile memory cell 400. For example, dielectric layer breakdown and associated current flow could define a logic "1," and no current flow could define a logic "0."

Advantageously, therefore, the benefits of the non-volatile embedded memory cell structures described herein include: (1) a programming voltage generated internally to the memory cell, (2) no high voltage transistors needed for routing the high programming voltage to the memory cell, (3) no special structures, special processing techniques and/or process modifications are required to integrate the non-volatile memory cell structure with other CMOS circuitry (4) an ability to be used with advanced technology where feature sizes are reduced and there is an increase in the gate dielectric layer leakage which makes it increasingly difficult to sense the conduction of a broken down gate dielectric layer that was programmed versus a non-broken gate dielectric layer where the conduction is from leakage.

Having thus described several aspects of at least one embodiment of this invention, it is to be appreciated various alterations, modifications, and improvements will readily occur to those skilled in the art. For example, equivalent elements may be substituted for those illustrated and described herein and certain features of the invention may be utilized independently of the use of other features, all as would be apparent to one skilled in the art after having the benefit of this description of the invention. Such alterations, modifications, and improvements are intended to be part of this disclosure, and are intended to be within the scope of the invention. Accordingly, the foregoing description and drawings are by way of example only.

What is claimed is:

1. A non-volatile memory cell comprising:
    an antifuse element having a programming node and a control node, the antifuse element being configured to have changed resistivity after the programming node is subjected to one or more voltage pulses, the change in resistivity representing a change in logic state;
    a capacitor element coupled to the programming node of the antifuse element and configured to provide the one or more voltage pulses to the programming node;
    a precharge element coupled to the programming node of the antifuse element and the capacitor element and configured to increase the one or more voltage pulses provided to the programming node;
    an access element coupled to the control node of the antifuse element, the access element configured to allow determination of the logic state of the antifuse element based on current flow through the access element; and
    a leakage element coupled to the control node of the antifuse element and the access element, the leakage element configured to modify the current flowing through the access element when the resistivity of the antifuse element has not been changed.

2. The non-volatile memory cell of claim 1, wherein the antifuse element comprises a MOS transistor having a gate, a source, and a drain, wherein one of the programming node and the control node of the antifuse element is connected to the gate of the MOS transistor, and wherein the other of the programming node and the control node of the antifuse element is connected to the source and the drain of the MOS transistor.

\* \* \* \* \*